US012748171B2

(12) United States Patent
Otake et al.

(10) Patent No.: US 12,748,171 B2
(45) Date of Patent: Sep. 29, 2026

(54) MAGNETIC RESONANCE IMAGING APPARATUS AND AUTOMATIC CHANNEL SELECTION METHOD OF MULTI-CHANNEL RECEPTION COIL

(71) Applicant: FUJIFILM Healthcare Corporation, Kashiwa (JP)

(72) Inventors: Yosuke Otake, Tokyo (JP); Yukio Kaneko, Tokyo (JP); Toru Shirai, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 151 days.

(21) Appl. No.: 18/751,585

(22) Filed: Jun. 24, 2024

(65) Prior Publication Data

US 2025/0012881 A1 Jan. 9, 2025

(30) Foreign Application Priority Data

Jul. 7, 2023 (JP) ................................ 2023-112516

(51) Int. Cl.

| | |
|---|---|
| ***G01V 3/00*** | (2006.01) |
| ***G01R 33/3415*** | (2006.01) |
| ***G01R 33/36*** | (2006.01) |
| ***G01R 33/54*** | (2006.01) |
| ***G06T 7/00*** | (2017.01) |

(52) U.S. Cl.

CPC ....... *G01R 33/543* (2013.01); *G01R 33/3415* (2013.01); *G01R 33/3664* (2013.01); *G06T 7/0012* (2013.01); *G06T 2207/30004* (2013.01)

(58) Field of Classification Search

CPC .............. G01R 33/287; G01R 33/4835; G01R 33/5608; A61B 2090/374

USPC ........................................................ 324/309

See application file for complete search history.

(56) References Cited

U.S. PATENT DOCUMENTS

| | | | |
|---|---|---|---|
| 2014/0184218 A1 | 7/2014 | Heukensfeldt Jansen et al. | |
| 2020/0034007 A1* | 1/2020 | Kawano ............. | H04N 1/00416 |

FOREIGN PATENT DOCUMENTS

| | | | | |
|---|---|---|---|---|
| CN | 113269299 A | * 8/2021 | ............. | G06N 3/045 |
| JP | 2011254633 A | * 12/2011 | ............ | B60L 53/122 |
| JP | 2014-128667 A | 7/2014 | | |
| JP | 2020-141732 A | 9/2020 | | |
| WO | WO-2014050019 A1 | * 4/2014 | ....... | A61B 1/000094 |
| WO | WO-2020234207 A1 | * 11/2020 | ............. | A61B 6/037 |

* cited by examiner

*Primary Examiner* — Walter L Lindsay, Jr.
*Assistant Examiner* — Frederick Wenderoth

(57) ABSTRACT

A camera image of a subject to be examined after mounting a reception coil, which is acquired before the subject to be examined is transported to an imaging position, information for specifying a position (target position) of an imaging site of the subject to be examined, and design information of the reception coil are collated with each other, an element of the reception coil that includes the target position is selected, and a coil region to be activated, which includes the selected element, is determined. The target position is specified by a method such as a user designation on the camera image of the subject to be examined before mounting the reception coil, or a user designation on a pre-scan image. Image reconstruction is performed using a signal received by the element in the activated coil region.

19 Claims, 16 Drawing Sheets

PRE-SCAN IMAGE

MAGNETIC RESONANCE IMAGING APPARATUS AND AUTOMATIC CHANNEL SELECTION METHOD OF MULTI-CHANNEL RECEPTION COIL

CROSS REFERENCE TO RELATED APPLICATION

The present application claims priority from Japanese Patent Application No. 2023-112516 filed on Jul. 7, 2023, the content of which is hereby incorporated by reference into this application.

BACKGROUND OF THE INVENTION

1. Field of the Invention

The present invention relates to a technique for automating channel selection in a magnetic resonance imaging (hereinafter, referred to as MRI) apparatus using a multi-channel reception coil.

2. Description of the Related Art

In an MRI apparatus, for a reception coil that receives a nuclear magnetic resonance signal from a subject to be examined, an RF transmission coil for high-frequency magnetic field irradiation fixed to the apparatus also serves as the reception coil in some cases, but a reception coil in which a plurality of loop coils (surface coils) that are mounted to be fitted to an examination site of the subject to be examined are disposed is widely used from the fact that signals from the examination site can be detected with high sensitivity.

The surface coils have various forms in which a plurality of coil elements tailored to the shapes of examination sites, such as a head, an abdomen, and limbs, are combined. The plurality of elements are connected to a plurality of channels of a receiver, and image reconstruction is performed using the nuclear magnetic resonance signals received by the plurality of channels. Since increasing the number of channels of the reception coil generally improves image quality, the reception coil is increasingly multi-channeled. In addition, various developments have been made to improve a workflow of coil settings, such as a reception coil unit with a wide sensitivity region in which a large number of elements are disposed so that a plurality of sites can be imaged in a single coil setting.

Further, in the workflow including coil settings, positioning the examination site on which the reception coil is mounted at a magnetic field center is important in order to obtain favorable image quality, and techniques for achieving this have also been proposed (JP2014-128667A and JP2020-141732A).

SUMMARY OF THE INVENTION

The above-described multi-channel reception coil that makes it possible to image a plurality of locations at once is mounted on the subject to be examined such that a wide region, for example, a chest or an abdomen of the subject to be examined, is covered, but even in a case where the examination site is a part of tissues or organs included in the chest or the abdomen, signals from all the channels are processed, which leads to a probability of a decrease in image quality of a target site due to the mixing of unnecessary signals. In addition, an increase in the number of channels increases the cost of a reception system. Therefore, in order to obtain high image quality for a predetermined examination site, it is necessary to select a necessary channel and generate an image.

The technique described in JP2014-128667A is a technique for attaching a plurality of markers to a reception coil, designating a marker closest to an examination site, and positioning a subject to be examined such that a marker position thereof is at a predetermined position in a magnetic field space, but cannot solve the above-described problem. In addition, the technique described in JP2020-141732A is a technique for receiving a user designation of a position of interest using a camera image and moving a region of interest to a magnetic field center to acquire a scout image, but similarly does not solve the above-described problem.

Further, in a case where the subject to be examined is moved to an imaging space (magnetic field center), a blanket or the like may be placed over the subject to be examined on which the reception coil is mounted from above. In such a case, in the related art, it is difficult to position a designated region of interest at the magnetic field center by using the desired marker position or the camera image.

An object of the present invention is to provide a technique of automatically selecting a coil element or a coil region consisting of a plurality of coil elements, necessary and sufficient for imaging of a desired examination site, after mounting a reception coil comprising a plurality of coil elements (channels) on a subject to be examined. Another object of the present invention is to provide a technique capable of disposing the automatically selected coil region at a magnetic field center, thereby enabling acquisition of a favorable image of an examination site.

In order to solve the above-described problem, according to the present invention, a camera image of a subject to be examined after mounting a reception coil, which is acquired before the subject to be examined is transported to an imaging position, information for specifying a position (target position) of an imaging site of the subject to be examined, and design information of the reception coil are collated with each other, an element of the reception coil that includes the target position is selected, and a coil region to be activated, which includes the selected element, is determined.

That is, according to the present invention, there is provided an MRI apparatus comprising: an imaging unit that includes a multiple-channel receiver which receives a nuclear magnetic resonance signal generated by a subject to be examined; and a controller that controls the imaging unit, in which the controller includes a camera image acquisition section that acquires an image from a camera disposed in the MRI apparatus, a target position specification section that specifies a target position of imaging on the subject to be examined, and a collation section that collates a camera image, which is acquired by the camera image acquisition section and shows the subject to be examined on which a reception coil including a plurality of coil elements is mounted, with design information of the reception coil and determines a coil element of the reception coil that includes the target position specified by the target position specification section.

The design information of the reception coil is, for example, CAD data in a case of designing the reception coil, and includes information related to the design, such as the dispositions and the dimensions of the elements, an ID of the reception coil (a type, a size, or the like), and information regarding the relationship between the appearance and internal elements (a marker, a characteristic shape, or the like). Such design information of the reception coil is stored in an internal memory of the apparatus or an external storage device for each of a plurality of types of reception coils.

For example, the ID of the reception coil (the type, the size, and the like) or the information regarding the relationship with the internal elements (the marker, the characteristic shape, or the like) is attached to the reception coil as information that is discernible from the outside, that is, information captured as the camera image.

In addition, according to the present invention, there is provided an automatic channel selection method of a multi-channel reception coil, the method being for selecting a coil element of a multiple-channel reception coil used in an MRI apparatus, the method comprising: a step of acquiring an image from a camera disposed in the MRI apparatus; a step of specifying a target position on a subject to be examined; and a step of collating a camera image, which shows the subject to be examined on which the reception coil including a plurality of the coil elements is mounted, and the target position with design information of the reception coil and determining a coil element of the reception coil that includes the target position.

According to the present invention, it is possible to automatically select the element of the reception coil that includes the target position by collating the camera image and the target position associated with the camera image with the design information of the reception coil. As a result, it is possible to reconstruct an image with favorable image quality in which only the coil region including the target position is activated and a signal from an unnecessary element is excluded.

In addition, it is possible to dispose the target position at the magnetic field center even in a situation in which the reception coil is not captured by the camera because of a covering or the like that covers the reception coil after mounting the reception coil on the subject to be examined.

DESCRIPTION OF THE PREFERRED EMBODIMENTS

Figure 1:
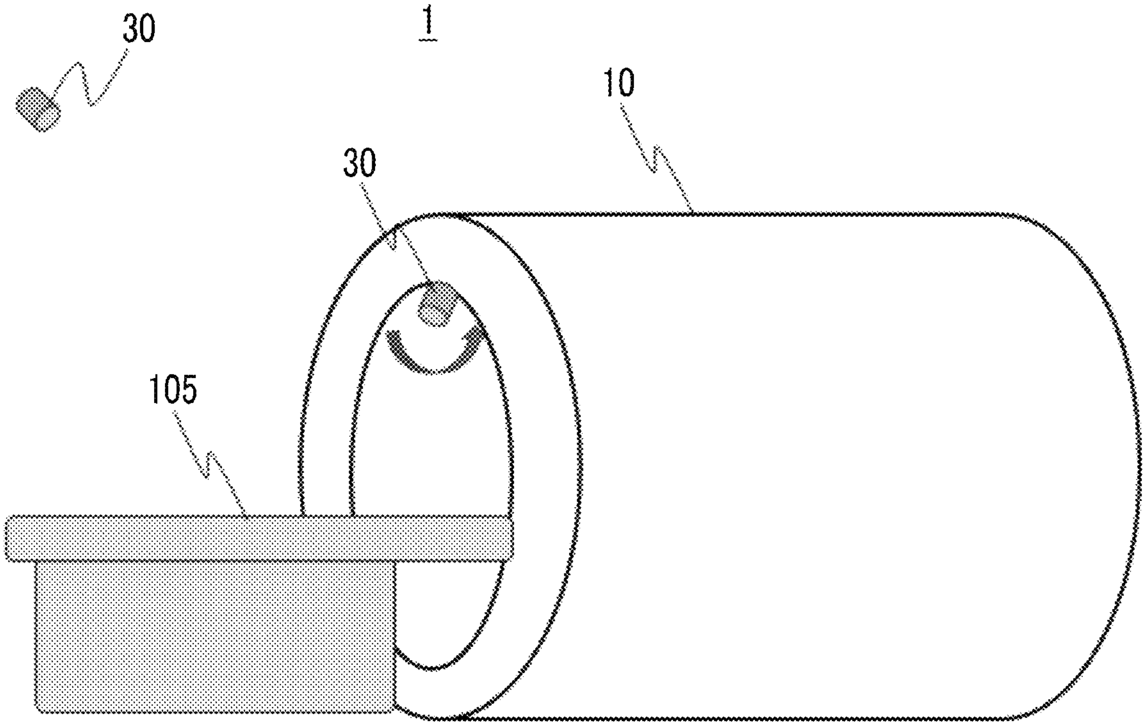
FIG. 1 is a diagram showing an overall outline of an MRI apparatus.

As shown in FIG. 1, an MRI apparatus 1 comprises a gantry 10 inside which a static magnetic field space for placing a subject to be examined is formed, and a bed 105 for transporting the subject to be examined into the gantry 10. The gantry 10 and the bed 105 are placed in an examination room shielded from electromagnetic waves.

A camera 30 for showing the subject to be examined placed on the bed 105 is installed in the examination room. In addition, a display device (not shown) that displays an image acquired by the MRI apparatus 1 is provided at an entrance of the gantry 10 or in the vicinity of the gantry 10, and an image (camera image) acquired by the camera 30 is also displayed on the display device. The camera image is used in a case of setting the subject to be examined at an appropriate position in the gantry 10 or in a case of mounting a reception coil, which will be described below, on the subject to be examined.

The type, the number of installation, and the installation position of the camera are not particularly limited. In FIG. 1, an example is shown in which the camera 30 is installed at two locations, such as in the vicinity of the entrance of the gantry 10 and an upper part of the examination room, that is, the ceiling, but the number of cameras may be one or three or more, and the installation location may be any position as long as the camera image required for the settings described above can be acquired. In addition, the camera 30 may be a camera that acquires a two-dimensional video or may be a stereo camera for enabling understanding of three-dimensional positions.

Figure 2:
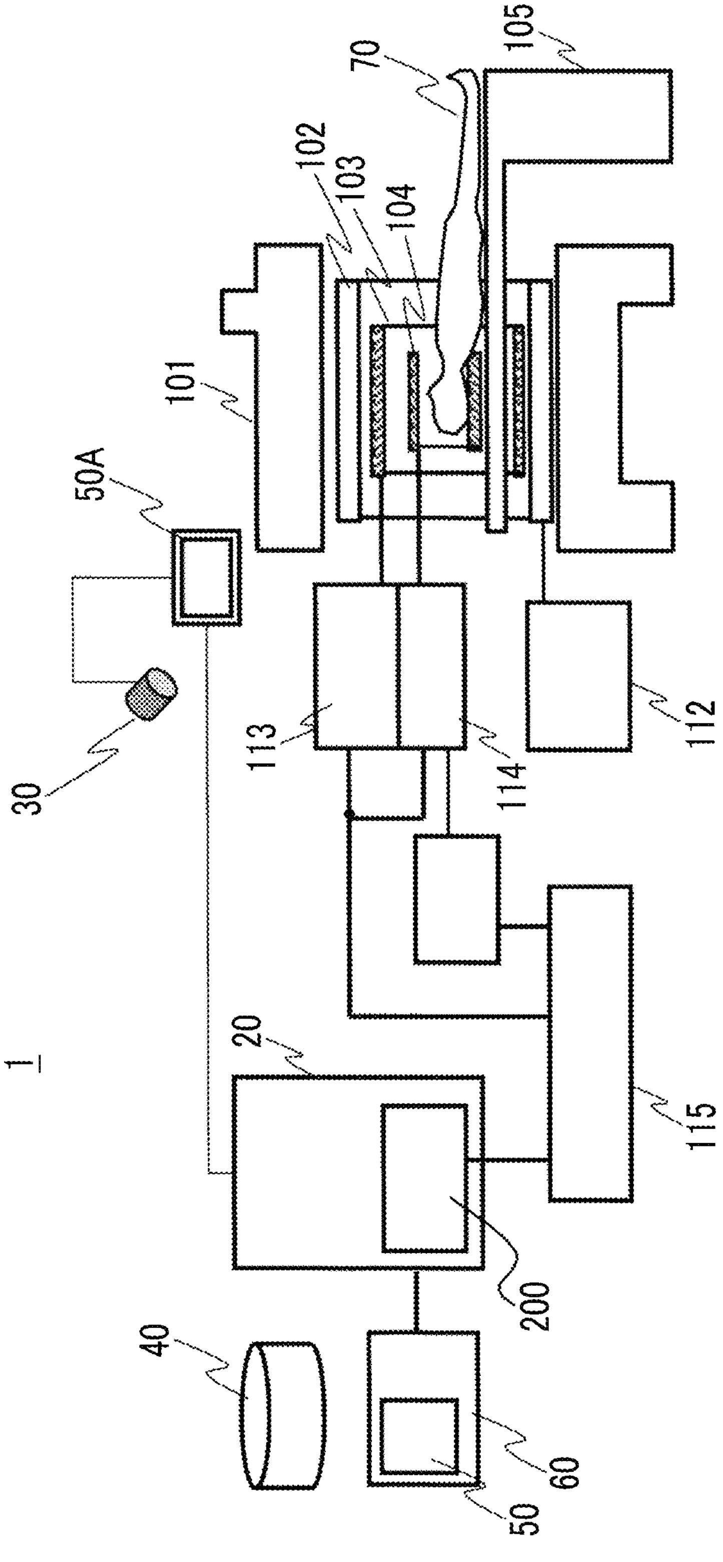
FIG. 2 is a block diagram of an imaging unit.

As shown in FIG. 2, the gantry 10 comprises a static magnetic field magnet 101 that generates a static magnetic field, a gradient magnetic field coil 102 that applies a magnetic field gradient in the static magnetic field space, and an RF coil 103 that generates a high-frequency magnetic field.

The gradient magnetic field coil 102 includes three sets of gradient magnetic field coils that generate gradient magnetic fields in three axial directions orthogonal to each other, and these three sets of gradient magnetic field coils are connected to a gradient magnetic field power supply 112 and are driven by power supplied from the gradient magnetic field power supply 112.

The RF coil 103 generates a high-frequency magnetic field of a magnetic resonance frequency for exciting the nuclei of atoms contained in the tissues constituting the subject to be examined and can also function as an RF reception coil that receives a nuclear magnetic resonance signal (NMR signal) generated by the subject to be examined. In the embodiment shown in FIG. 2, a reception-dedicated RF coil 104 is provided separately from the RF coil 103. The RF coil 104 is usually mounted on an examination site of the subject to be examined 70. In addition, although not shown in FIG. 1, there is also a case where the RF coil is fixed to the bed. Both the RF coil 103 and the RF coil 104 can function as a transmission coil that generates a high-frequency magnetic field and a reception coil that receives an NMR signal, but here, as an example, a case is shown in which the RF coil 103 is the transmission coil and the RF coil 104 is the reception coil, and the RF coil 103 is connected to a transmitter 113 comprising a high-frequency generator and the like, and the RF coil 104 is connected to a receiver 114 comprising a demodulator, an A/D converter, and the like.

In a case of a multiple-channel reception coil in which the reception coil is composed of a plurality of coil elements (hereinafter, simply referred to as elements), the receiver 114 is composed of a plurality of receivers (a plurality of channels) each comprising an amplifier, a demodulator, and an A/D converter for each channel. However, it is not always necessary for the number of channels of the reception coil to match the number of channels of the receiver, and there may be a case where control to switch the connection is appropriately performed. The output of each receiver is sent to a signal processing circuit.

The MRI apparatus 1 comprises a sequencer 115 that operates the gradient magnetic field power supply 112, the transmitter 113, the receiver 114, and the like in accordance with a predetermined pulse sequence, and the sequencer 115 executes a series of operations, such as irradiating the subject to be examined disposed in the static magnetic field space with a high-frequency magnetic field pulse, receiving the NMR signal from the subject to be examined, and applying a gradient magnetic field pulse to impart position information to the NMR signal.

The respective units described above are collectively referred to as an imaging unit 100 of the MRI apparatus 1. The MRI apparatus 1 comprises a computer 20 that controls each unit of the imaging unit 100 via the sequencer 115 and that performs various calculations related to a signal acquired by the imaging unit 100 or an image reconstructed from the signal. Hereinafter, a control function of the computer 20 will be referred to as a controller 200. The computer 20 can be configured with a general-purpose computer or a workstation comprising a CPU or a GPU, and a memory and can perform desired control and calculations by reading and executing a program required for the control and the calculation through the CPU. Some of the calculations performed by the computer 20 may be performed by a programmable IC such as an ASIC or an FPGA, and the hardware is also referred to as the computer.

A UI unit 60, which is an interface with a user, and an external storage device 40 are connected to the computer 20. The UI unit 60 is provided with a display device 50 that displays the image acquired by the MRI apparatus 1 and GUIs, an input device (not shown), and the like. In addition, a display device 50A that is disposed in the vicinity of the gantry 10 and displays the camera image is also connected to the computer 20, and the display device 50A can also display the image acquired by the MRI apparatus 1, in addition to the camera image.

Figure 3:
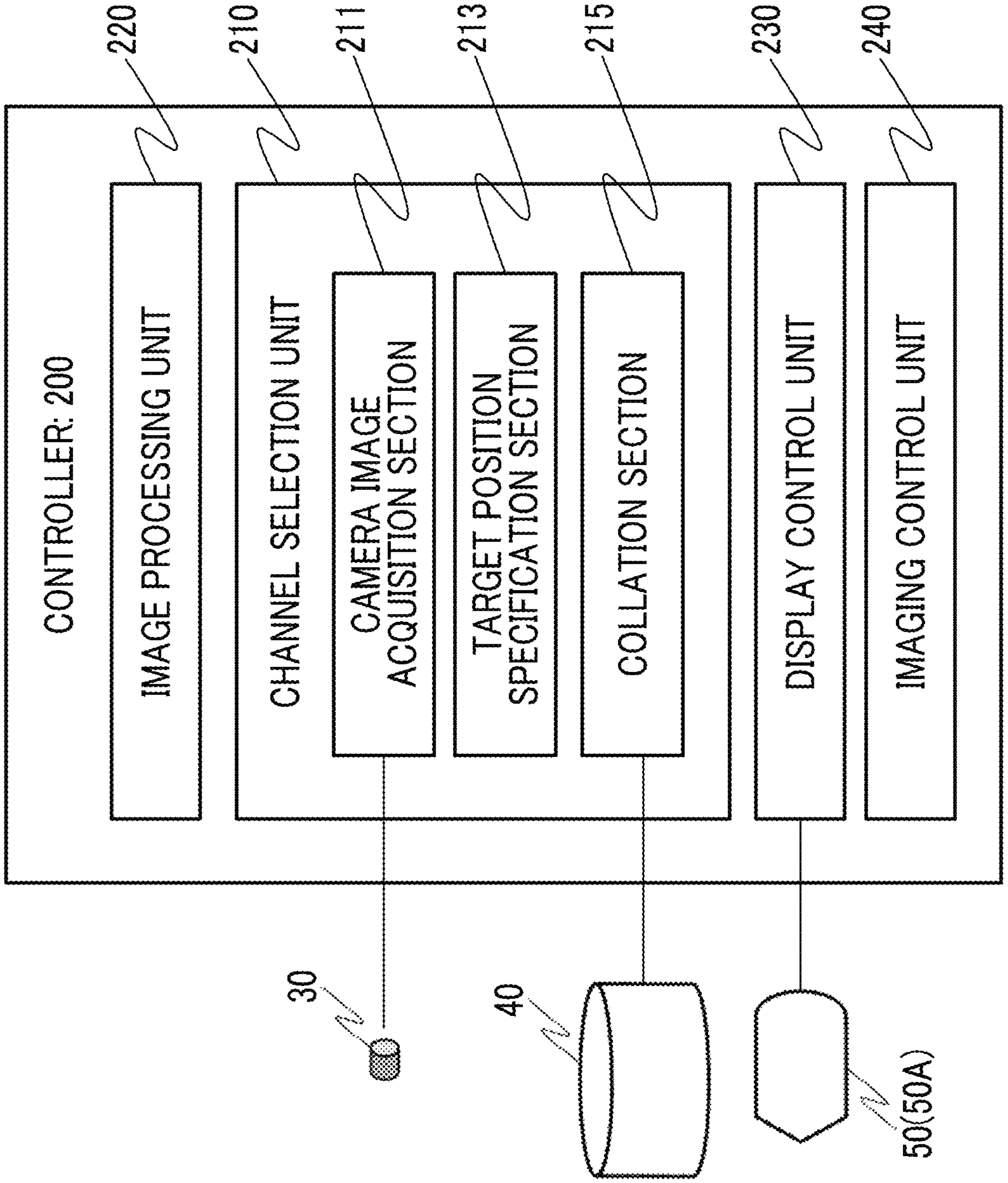
FIG. 3 is a block diagram of a controller.

In the present embodiment, the function of the computer 20 (controller 200) further includes a function of selecting a desired coil element or coil region from the multi-channel coil by using the camera image acquired by the camera 30 and the design information of the reception coil (channel selection function). As components for implementing this function, as shown in FIG. 3, the computer 20 comprises a camera image acquisition section 211 that acquires the camera image captured by the camera 30, and a collation section 215 that collates the camera image, in which the reception coil including the plurality of coil elements and a portion of the subject to be examined on which the reception coil is mounted are captured, with the design information of the reception coil and that determines an element of the reception coil.

The computer 20 further comprises a target position specification section 213 that specifies a target position of imaging on the subject to be examined, and the collation section 215 uses the camera image, the design information of the reception coil, and the target position specified by the target position specification section 213 to select an element of the reception coil to be used to image the target position, or to specify a coil region including the coil element. These functions are collectively referred to as a channel selection unit 210.

The design information of the reception coil may include, for example, sizes, shapes, or dispositions of the plurality of elements constituting the reception coil, such as CAD data of the reception coil, and an ID (a number representing a type, a model, or the like) of the reception coil, and may further include information for enabling understanding of a positional relationship between an appearance of the reception coil and the element disposed inside the reception coil from the appearance. The information for enabling the understanding of the positional relationship between the appearance of the reception coil and the element disposed inside the reception coil from the appearance may be, for example, a marker or an ID display part attached to the surface of the reception coil, or a feature of the shape of the reception coil itself. In the following description, a marker is used as a representative of the information for enabling the understanding from the appearance, but in this case as well, the term “marker” is not limited and includes the above-described broad information. The design information of the reception coil is stored in, for example, the external storage device 40, and is read out by the computer 20 from the external storage device 40 and is used by the collation section 215 for the selection of the coil element.

There are several methods of specifying the target position by the target position specification section 213, such as a method using a camera image and a method using an image acquired by the MRI apparatus, which will be described in detail in the embodiment to be described below.

The “mounting of the reception coil on the subject to be examined” includes not only the attachment to each site of the subject to be examined but also a state in which the reception coil is disposed or exists at a fixed position with respect to the subject to be examined.

With the MRI apparatus 1 having the above-described configuration, the computer 20 (controller 200) has a function of collating the design information of the reception coil with the camera image of the subject to be examined on which the reception coil is mounted, and selecting a predetermined channel (coil element) of the reception coil. Therefore, only the channels of the coil region including the examination site are driven to perform the imaging, and the image reconstruction is performed without using the signal from the unnecessary channel for the imaging, so that it is possible to obtain a reconstructed image having favorable image quality. In addition, since it is not necessary to provide an excessive number of reception channels as the receiver 114, the configuration of the receiver 114 can be simplified.

Hereinafter, specific embodiments corresponding to various reception coils and target position specification methods will be described.

Embodiment 1

In the present embodiment, an embodiment to be applied to a reception coil that is mounted such that the reception coil covers an upper surface of the imaging site of the subject to be examined, and that is provided with markers attached to a plurality of outer locations will be described.

As shown in the functional block diagram of FIG. 3, the computer 20 of the MRI apparatus 1 of the present embodiment comprises an image processing unit 220 that performs image reconstruction by using the NMR signal received by the receiver 114 and that performs correction and other processing using the reconstructed image, a display control unit 230 that generates a display image displayed on the display devices 50 and 50A and that performs control of the display, an imaging control unit 240 that controls the imaging unit 100 via the sequencer 115, and the channel selection unit 210 that selects a channel of the reception coil.

The channel selection unit 210 includes the camera image acquisition section 211, the target position specification section 213, and the collation section 215. The target position is a position of a site which is targeted for imaging or a position of an axis for specifying a cross section including the site, and specifying the target position includes a case of being specified by a point or a line and a case of being specified by a shape (a circle, a square, a contour of a tissue, or the like) having a predetermined area.

Hereinafter, a processing flow in the channel selection unit 210 in the computer 20 described above is shown in FIG. 4. First, before the subject to be examined is inserted into the gantry 10, the reception coil is mounted, and the camera image acquisition section acquires the camera image acquired by the camera 30 in a state in which the subject to be examined is laid on the bed 105, and the camera image is displayed on the display device 50A installed in the vicinity of the gantry 10 (S1).

Figure 5:
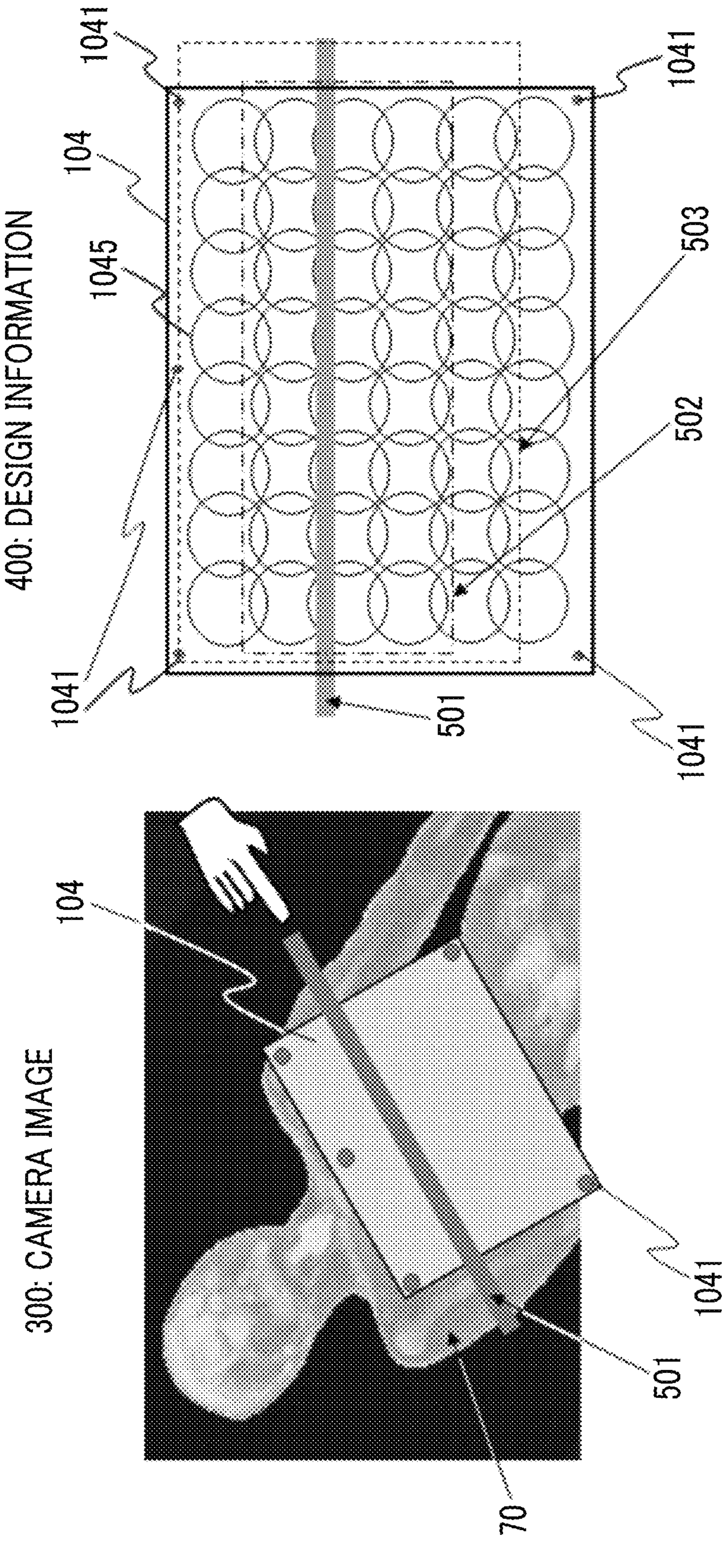
FIG. 5 is a diagram illustrating processing of Embodiment 1.

As shown on the left side of FIG. 5, the subject to be examined 70 and the reception coil 104 mounted on the imaging site (here, the chest) of the subject to be examined are shown in a camera image 300. In addition, markers 1041 are attached to a plurality of locations (in FIG. 5, five locations including four corners and a center of an upper side) on the surface of the reception coil 104, and the markers 1041 are also shown in the camera image.

Meanwhile, the target position specification section 213 acquires the position of the target of the subject to be examined by using the camera image or an MR image of the subject to be examined acquired in advance (S2). In the present embodiment, a case where the position of the target is specified (FIG. 4: dotted line arrow) by using the camera image will be described as an example. In this example, an examination technician or a doctor (hereinafter, referred to as a user) performs a specific gesture by hand with respect to the imaging site (target) of the subject to be examined lying on the bed 105. Here, an example of pointing to the edge of the bed is shown. In addition, a laser or the like for positioning, which is provided in the apparatus, may be used, and the method therefor is not limited to these methods as long as the position can be shown in the camera image. In the example shown in FIG. 5, the user's hand gesture virtually constructs a line 501 vertically in a left-right direction of the bed, and the line 501 indicates the target position. A positional relationship between the subject to be examined, the target of the subject to be examined, and the reception coil can be understood in the camera image acquired in this state.

Next, the collation section 215 collates information, the marker position, and the target position, which are obtained from the camera image, with the design information of the reception coil and specifies the coil element including the target position (S3). The diagram on the right side of FIG. 5 shows design information 400 of the reception coil, and the collation section 215 specifies the marker position included in the design information 400 and the marker position of the camera image 300 that corresponds to the marker position included in the design information 400, and then specifies the element corresponding to the line position from the positional relationship between the positions of the markers 1041 and the line 501 in the camera image 300. In the example shown in the drawing, coil elements 1045 are arranged in a matrix of 8×6, and the elements in the second row and the third row are specified as the elements including the line 501 (S4).

In the above description, a case has been described in which the user designates the target position in a state in which the reception coil is mounted, but the target position may be designated in a state in which the reception coil is not mounted, and the target position specification section 213 may specify the target position on the camera image by using the camera image in this state. The collation section 215 may use the target position specified in the camera image before mounting the reception coil and the camera image 300 acquired after mounting the reception coil on the subject to be examined at this bed position to specify the target position on the camera image after mounting the reception coil.

By using the information of the camera images before and after the mounting, the element position and the target position on image coordinates of the camera images can be understood. After that, selecting the coil region including the target position by collating the marker position and the target position, which are specified on the camera image, with the design information of the reception coil is the same as a case of specifying the target position after mounting the reception coil.

In a case where a FOV 502 of the imaging is further determined, the collation section 215 selects a region covering the FOV 502 as a coil region 503. Since the FOV is usually set to a value such as 450 mm or 350 mm in a body axis direction as a default of the apparatus, the coil region 503 can be selected to cover the FOV by determining the FOV position such that the line 501 is at the center of the FOV in the body axis direction. As a result, the NMR signals from the inside of the FOV and the periphery thereof can be received, and the deterioration in image quality due to the reduction in the number of elements can be prevented.

After that, the bed 105 is moved, the subject to be examined is inserted into the gantry 10 and is positioned such that the target position is at the magnetic field center, and imaging is performed (S5). In this positioning work of the subject to be examined, the relative distance on the image is obtained in advance, and the coordinates of the target are linked to an apparatus coordinate system to calculate a required distance to the magnetic field center. Then, the bed need only be moved by that distance.

The information on the channel in the coil region determined by the channel selection unit 210 in this way is passed to the imaging control unit 240. The imaging control unit 240 activates (turns on) the selected channel (S6). In this case, control (for example, switching) for connecting the selected channel and the channel of the receiver is performed as necessary. In a case where all the elements of the reception coil are connected to the receiver, the switching is not necessary. The image reconstruction process using the received signal from each channel of the selected reception coil is the same as that of the conventional MRI apparatus, and the description thereof will be omitted here.

According to the present embodiment, by collating the marker attached to the reception coil and the camera image showing the target position designated by the user with the design information that indicates the element arrangement of the reception coil and the positional relationship between the element arrangement and the marker, it is possible to automatically specify the region (coil region) of the element including target, and it is possible to perform imaging by activating only the channel in this region. As a result, it is possible to achieve improved image quality and simplification of the receiver.

Modification Example 1: Modification Example of Coil Region

Figure 6:
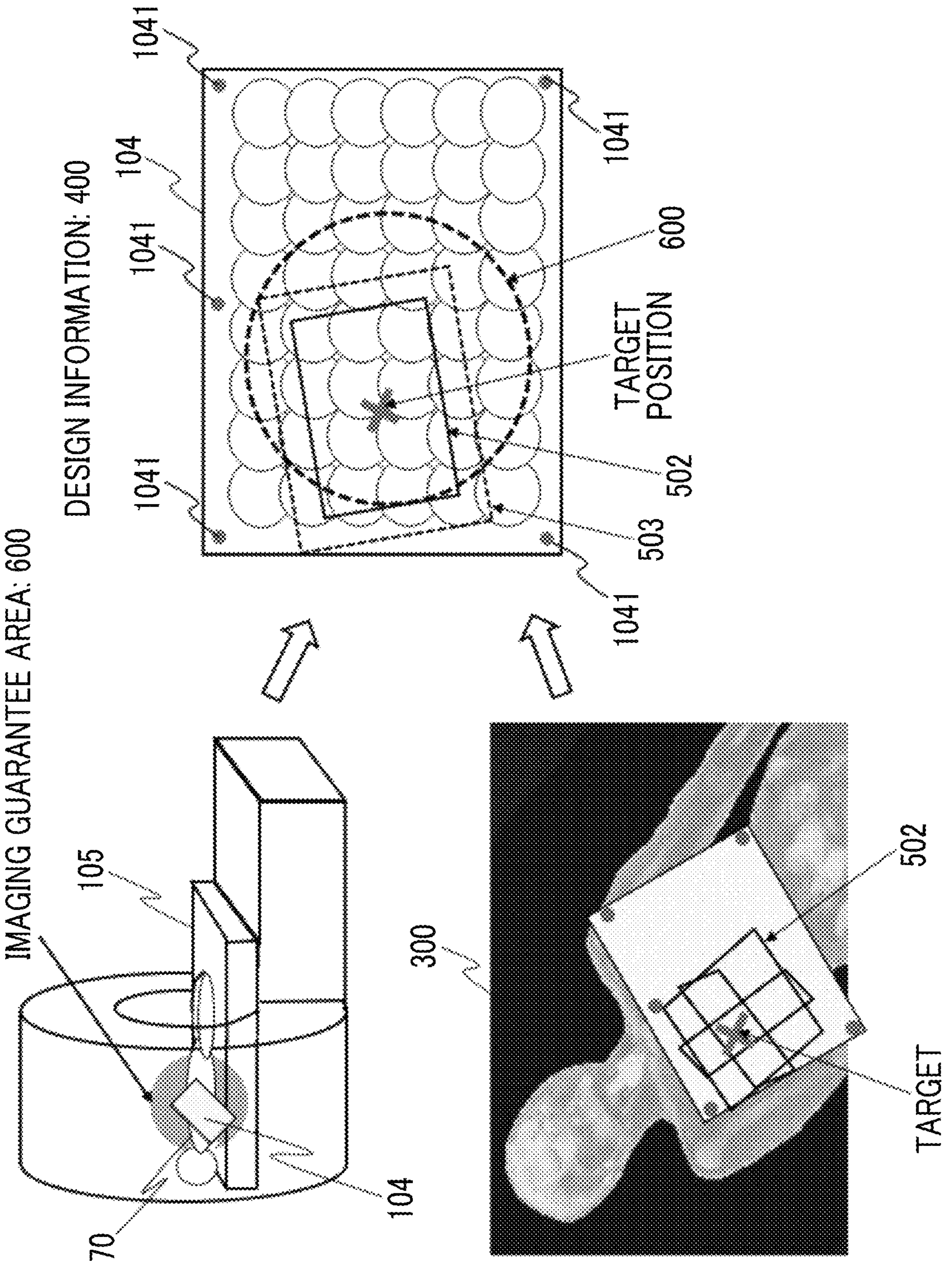
FIG. 6 is a diagram illustrating coil region determination according to Modification Example 1.

In the above-described embodiment, in the determination of the coil region, one or a plurality of elements including the target position are selected, and the region including the plurality of elements and covering the FOV is determined as the coil region, but the coil region may be determined by further considering an imaging area (hereinafter, referred to as an imaging guarantee area) in which predetermined image quality is ensured. An imaging guarantee area 600 is apparatus characteristics that are determined in a range in which the distance from the magnetic field center at which the magnetic field uniformity is maintained and the linearity of the gradient magnetic field is maintained, as shown in FIG. 6 (right side). The collation section 215 holds such information on the imaging guarantee area as a map, or reads out the information on the imaging guarantee area from the internal memory of the computer 20 or the external storage device 40, takes AND between the selected channel (coil region) 503 and the imaging guarantee area 600, and excludes an element that falls outside the imaging guarantee area 600 from the coil region 503 to define the coil region.

According to the present modification example, by excluding the element outside the imaging guarantee area from the elements to be activated, it is possible to prevent a decrease in image quality caused by the signal from the element in which image quality cannot be ensured being used for image reconstruction.

The present modification example can be applied to each of embodiments to be described below in addition to Embodiment 1.

Modification Example 2: Modification Example of Target Position Specification In Embodiment 1 described above, a case has been described in which the target position specification section 213 specifies the target as the position pointed to by the user's gesture or laser, but in the present modification example, the collation section 215 specifies the target by using a statistical anatomical database.

Figure 7:
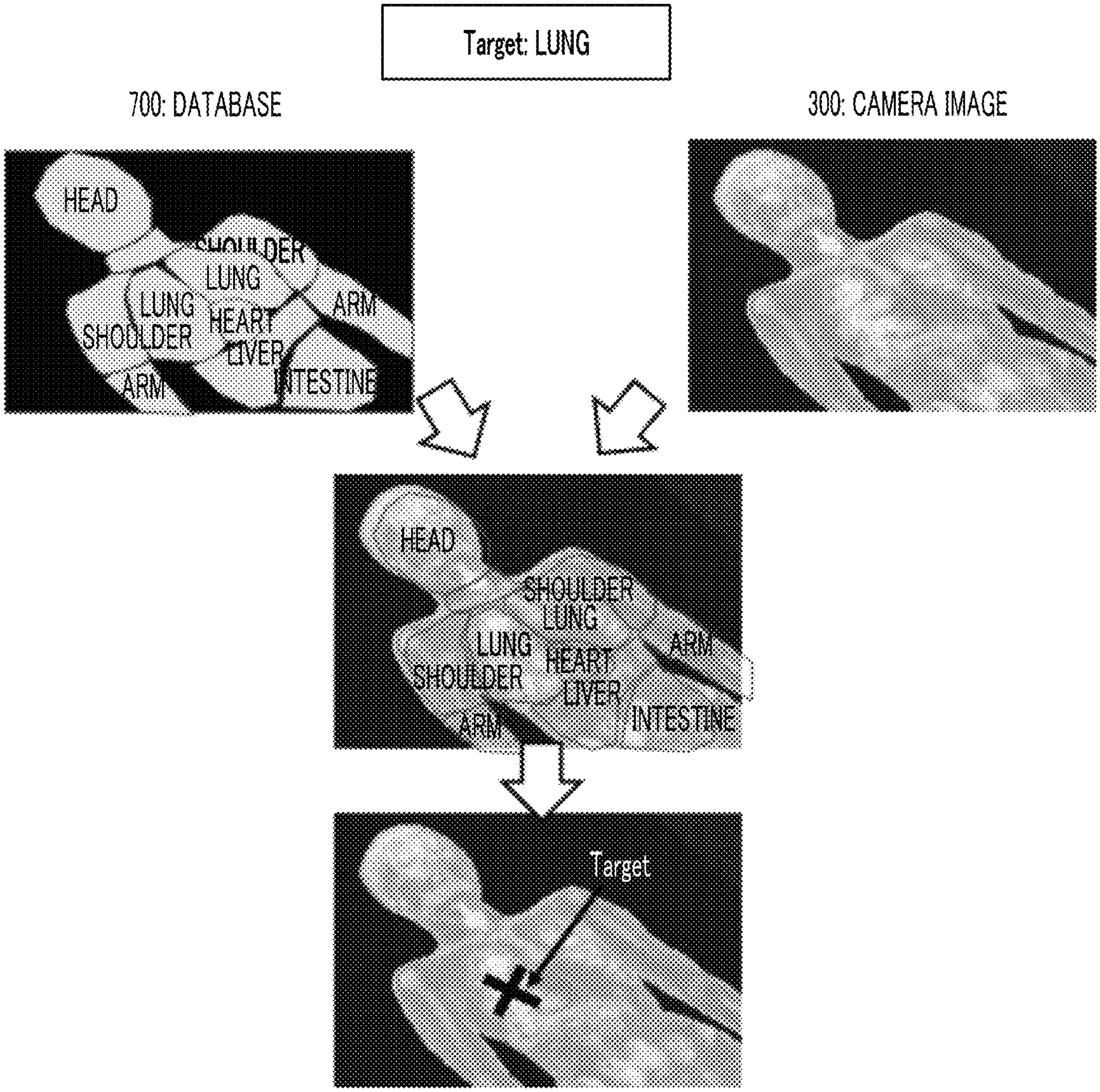
FIG. 7 is a diagram illustrating target position specification according to Modification Example 2.

Specifically, first, the user designates an anatomical site to be targeted to the computer 20. The camera image acquisition section 211 receives information including the user designation together with the camera image. The target position specification section 213 superimposes an anatomical database 700 on the camera image 300 by using a method such as non-rigid registration, as shown in FIG. 7, analyzes and estimates an anatomical position, and specifies the site as the target position.

After that, the collation section 215 collates the camera image (including the subject to be examined, the marker position of the reception coil, and the information on the specified target position) with the design information of the reception coil and determines the element/coil region including the target position, which is the same as in Embodiment 1.

As a method using the anatomical database, a method of designating the target position from examination information instead of the camera image can also be employed. Usually, in a case of imaging, information such as an examination item and an examination site is input to the MRI apparatus (computer 20) together with information on the subject to be examined. The collation section 215 determines the target site from the input information and specifies the site of the anatomical database. For example, in a case of a heart function examination, the heart is the target site, and in a case of a shoulder joint examination, the shoulder is the target site.

After that, the camera image is collated with the anatomical database, and a position on the camera image corresponding to the MRI image of the site specified in the anatomical database is set as the target site. According to the present modification example, by using the anatomical database, it is possible to specify the target position on the camera image without anatomical knowledge, and it is possible to easily perform the collation with the design information of the reception coil.

Embodiment 2

Figure 8:
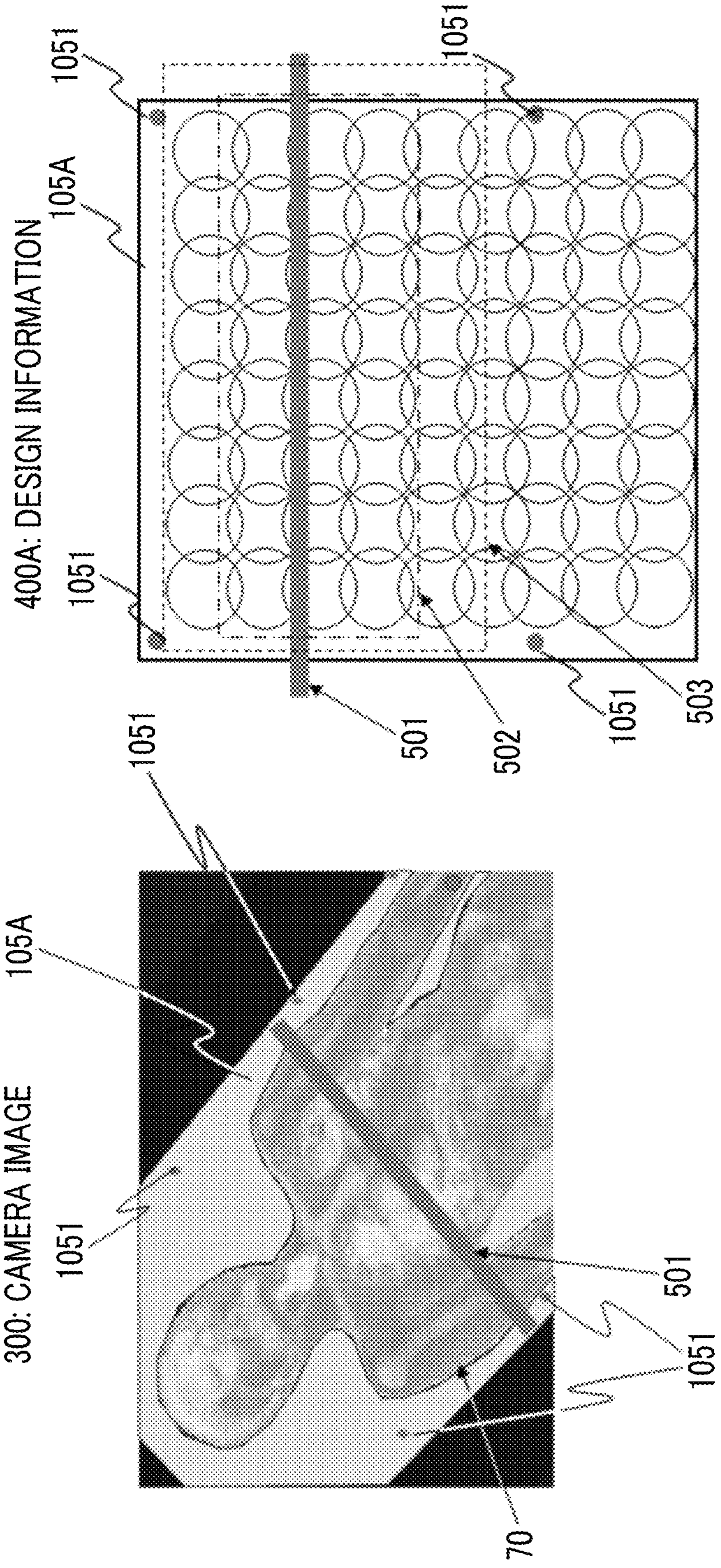
FIG. 8 is a diagram illustrating processing of Embodiment 2.

The present embodiment is an embodiment in which the present invention is applied to an MRI apparatus in which the reception coil is incorporated into the bed on which the subject to be examined is placed. In the present embodiment, as shown in FIG. 8, a marker 1051 is attached to a reception coil incorporated bed 105A, and design information 400A of the reception coil includes a positional relationship between the element disposition and the marker 1051.

Figure 4:
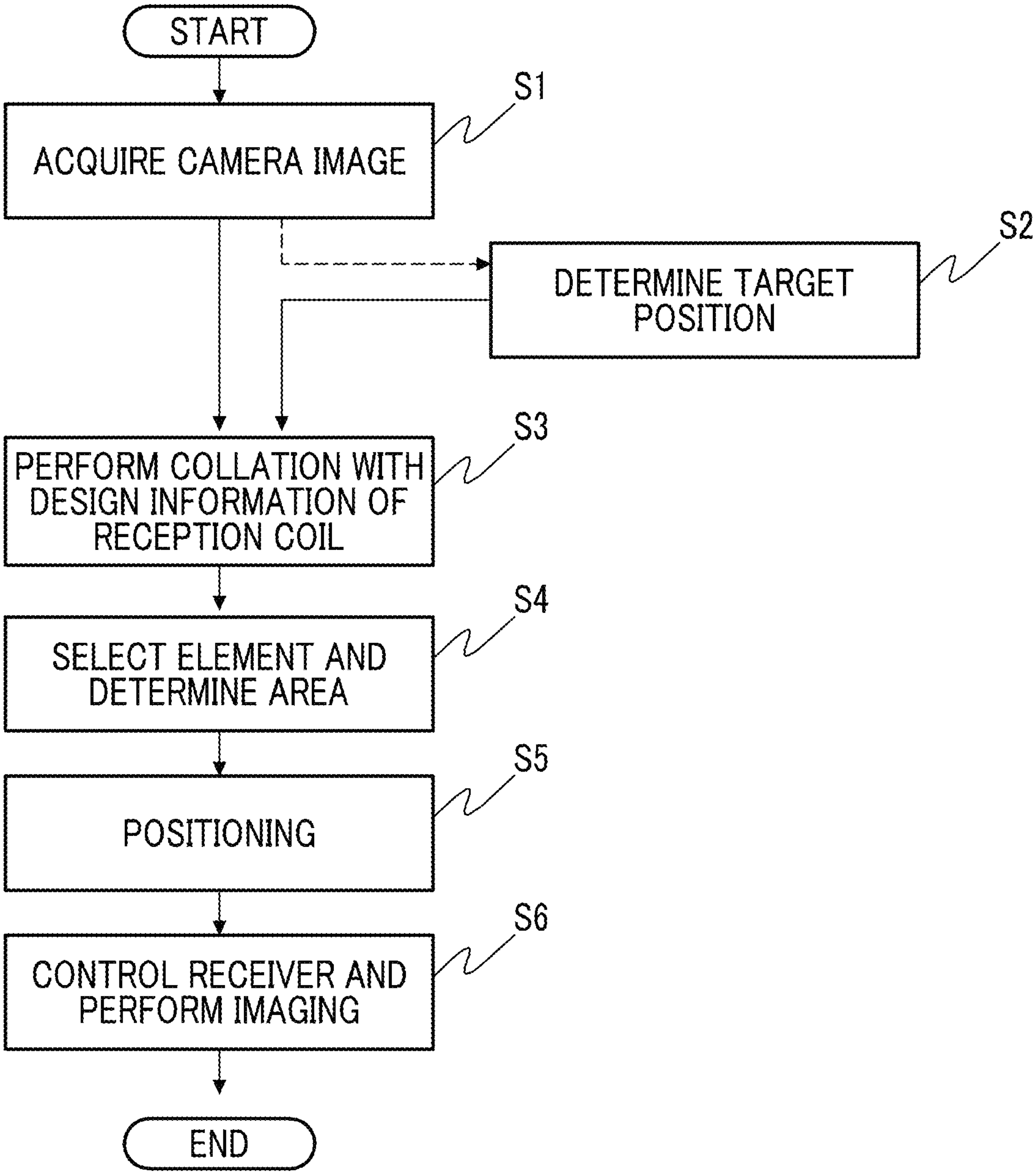
FIG. 4 is a diagram showing a flow of an operation of a channel selection unit.

In the present embodiment as well, the configuration and the processing flow of the channel selection unit 210 are the same as the configuration and the flow shown in FIGS. 3 and 4. That is, the collation section 215 collates the camera image acquired before being inserted into the gantry 10, that is, the camera image including the subject to be examined lying on the bed and the target position designated by the gesture or the like on the subject to be examined, with the design information of the reception coil to select the channel including the target position, and determines the coil region (S1 to S4). The coil region may be set to include the FOV, which is the same as in Embodiment 1. After that, imaging is performed by turning on only the channel of the selected coil region (S5 and S6).

According to the present embodiment, since the marker is attached to the bed of which the position in the apparatus coordinate system can be understood, the selected coil region (target position) can be positioned at the magnetic field center of the apparatus in absolute coordinates by using the relationship between the marker and the target position understood in the camera image.

Embodiment 3

Similar to Embodiment 1, the present embodiment is an embodiment in which the channel is selected for the reception coil 104 with the marker attached, which is mounted on the subject to be examined, but the present embodiment is characterized in that the marker 1051 is also attached to the bed. The processing flow of the channel selection is the same as in Embodiments 1 and 2, and the processing of the present embodiment will be described below with reference to FIG. 4 as necessary.

In the present embodiment as well, a form or a shape of the reception coil mounted on the subject to be examined is not particularly limited, but the sheet-shaped reception coil 104 mounted on the chest as in FIG. 5 will be described as an example. In addition, the bed 105 may be the simple bed 105 or may be the reception coil incorporated bed 105A similar to Embodiment 2.

Figure 9:
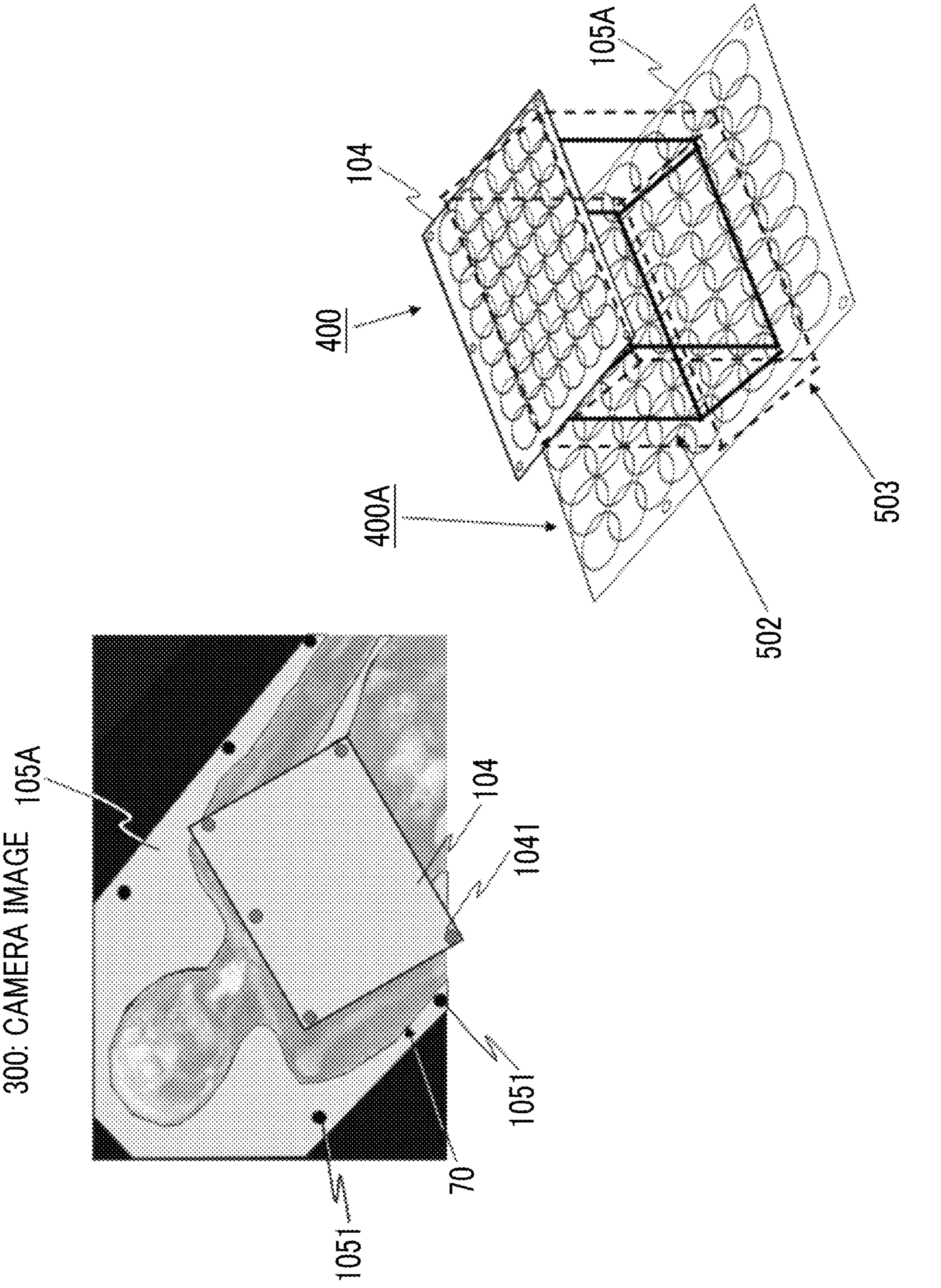
FIG. 9 is a diagram illustrating processing of Embodiment 3.

First, the camera image acquisition section 211 acquires the camera image 300 of the subject to be examined 70 lying on the bed 105A (FIG. 4: S1). As shown on the left side of FIG. 9, the subject to be examined 70 lying on the bed 105A and the reception coil 104 mounted on the subject to be examined are shown in the camera image 300, and the plurality of markers 1041 and 1051 respectively attached to the reception coil 104 and the bed 105A are also shown.

In the present embodiment as well, for example, similar to Embodiment 1, the target position may be designated by indicating the position of the target with a line (not shown in FIG. 9) using the gesture (S2).

The collation section 215 collates the line and the positions of each marker 1041 of the reception coil 104 and each marker 1051 of the bed 105A in the camera image 300 with the design information 400 of the reception coil 104 and the design information 400A of the reception coil incorporated into the bed (S3). As a result of the collation, first, the position of the reception coil 104 in the bed 105A is specified from the positional relationship between each marker 1041 of the reception coil 104 and each marker 1051 of the bed 105A in the camera image 300, and each marker 1051 of the bed 105A. Here, since the design information 400A of the reception coil of the reception coil incorporated bed 105A includes the positional relationship between the incorporated reception coil and the bed, and the position of the bed 105A in the apparatus coordinate system is understood, in the collation between the camera image 300 and the design information 400 and 400A of the reception coil, the reception coil 104 and the target position (the position of the line) in the apparatus coordinate system are specified.

In a case where the target position is specified in the design information 400 of the reception coil 104, the collation section 215 selects the element including that position and determines the coil region including the selected element (S4). The coil region is determined to include the FOV determined from the target position, which is the same as in Embodiment 1. Next, as shown on the right side of FIG. 9, an element on an incorporated coil side is selected to include a region in which the coil region is projected onto the incorporated coil side in a direction that is substantially orthogonal to a coil surface of the reception coil 104 (or in an up-down direction with respect to a horizontal bed), based on the three dimensional FOV. Here, since the arrangement and size of the element in the reception coil incorporated into the bed are usually different from those of the reception coil 104, by making the coil region of the incorporated reception coil wider than the coil region determined for the reception coil 104, it is possible to select the coil region that reliably includes the FOV.

In a case where the coil regions of two reception coils are determined, the bed 105A is moved, and the target is positioned at the magnetic field center (S5). In this case, since the position in the apparatus coordinate system of the target position is specified, the target can be easily positioned at the magnetic field center. Imaging is performed by activating the element in the selected coil region (S6).

According to the present embodiment, by attaching the marker to a bed side as well, the position in the apparatus coordinate system of the reception coil 104 mounted on the subject to be examined can be specified from the camera image, and the positioning can be accurately performed. In addition, in a case where the MRI image (for example, a pre-scan image to be described below) instead of the camera image is used in specifying the target position, the target position can be collated with the position of the reception coil (selected element) in the apparatus coordinate system.

Modification Example 3: Modification Example of Target Position Specification

In the above-described embodiments 1 to 3, a case has been described in which the target position specification section 213 specifies the target position by using the camera image and the information on the target position designated by the user, the target position may be specified by using the pre-scan image (MR image) acquired by the MRI apparatus in advance.

In this case, in the image of the pre-scan that is usually performed for the imaging position specification or the like, the target position specification section 213 acquires the information (2D images of three axes (three cross sections) or a 3D image) on the target position from the imaging region designated by the user such as a technician. The execution of the pre-scan and the presentation of the pre-scan image have been also performed in the conventional MRI apparatus, and this can be used, but in a case of executing the channel selection function, the execution may be performed by receiving a user instruction to perform the pre-scan and the image display thereof.

Figure 10:
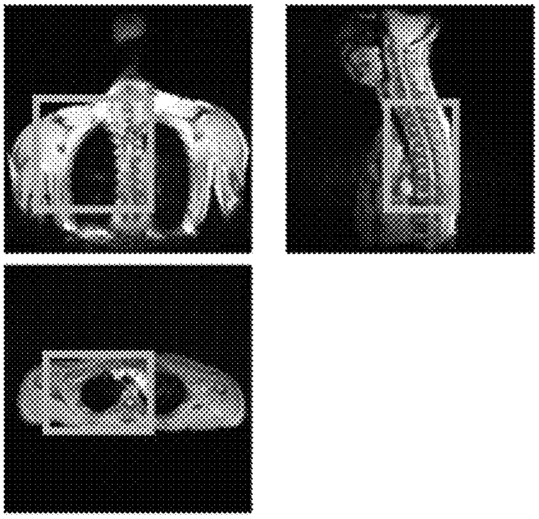
FIG. 10 is a diagram illustrating target position specification according to Modification Example 3.

FIG. 10 shows an example of the pre-scan image. In this example, the pre-scan images of the three cross sections (COR, SAG, and AX) including the spinal cord are obtained, and the user designates the target position by setting ROIs on these three cross sections. In such a pre-scan image, since the position on the image is associated with the position in the real space (the position in the apparatus coordinate system), designating the target position on the image enables the understanding of the target position in the real space with the movement of the bed. In the present modification example, the position of the target designated by the user on such a pre-scan image is acquired as the position information and used for the subsequent collation.

Specifically, first, the position (position in an imaging space) specified in the pre-scan image is converted into the position in the real space (position in the apparatus coordinates), and the converted position is held as the target position. After that, the camera image is acquired in a state in which the reception coil is mounted on the subject to be examined. The collation section 215 collates the reception coil and the position of the marker included in this camera image with design information (CAD data) of the reception coil to acquire the element position of the reception coil. Next, the subject to be examined is moved to the magnetic field center of the apparatus based on the information on the target position.

The collation section 215 further obtains the position of the reception coil in the apparatus coordinates from the position of the reception coil in the camera image. For example, in Embodiment 2 or Embodiment 3, by collating the marker position in the camera image showing the marker attached to the reception coil incorporated bed with the marker position of the bed in the apparatus coordinate system, the position of the reception coil on the apparatus coordinates can be obtained. Next, the position of the moved element is judged together with the target position on the apparatus coordinate system, and the coil region including the target position is determined. In the determination of the coil region, considering the FOV or further considering the imaging guarantee area is the same as in Embodiment 1 and Modification Example 1.

According to the present modification example, since the target position in the apparatus coordinate system is specified from the pre-scan image actually viewed internally, it is possible to specify the target position with higher accuracy than the target position designation using the camera, the laser, or the like, which provides only information on the appearance. In addition, in a case where the subject to be examined is positioned in the gantry, the target position can be easily positioned at the magnetic field center.

Embodiment 4

Embodiments 1 to 3 are examples in which a plurality of markers that can be read by the camera are provided in the reception coil, and a predetermined element is selected by collating the marker position with the marker position and the element arrangement included in the design information of the reception coil, but the present embodiment is characterized by the installation of the markers on the reception coil at a predetermined interval, thereby performing position correction of the marker of the reception coil in the camera image.

Since the configuration of the channel selection unit 210 is the same as in the above-described embodiment, description will be made by focusing on the differences from the above-described embodiment with reference to FIGS. 11 and 12.

Figure 11:
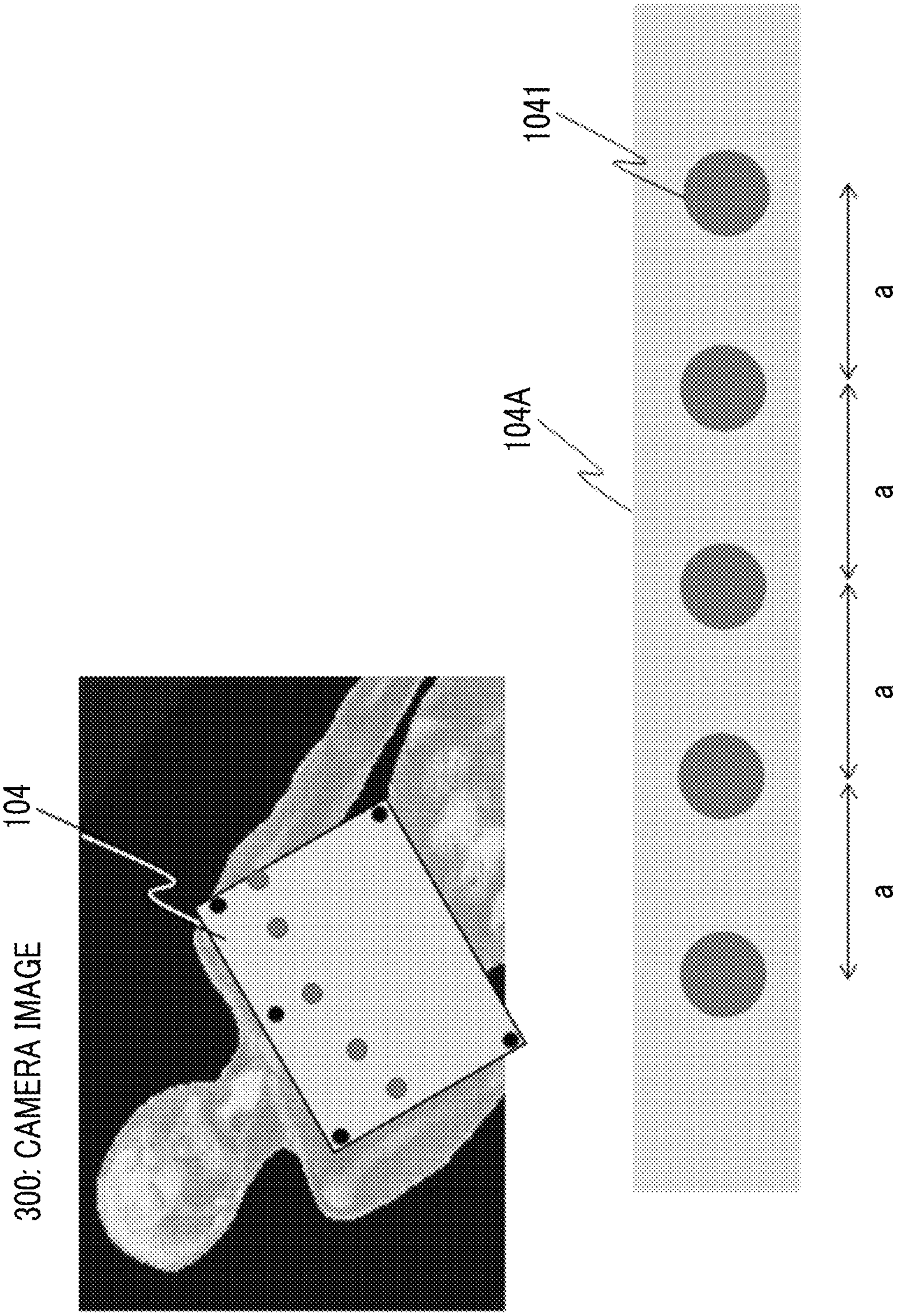
FIG. 11 is a diagram illustrating a reception coil to which Embodiment 4 is applied and a disposition of a marker.

FIG. 11 is a diagram schematically showing the camera image 300 of the subject to be examined on which the reception coil 104 is mounted. As shown in the drawing, the plurality of markers 1041 are provided on the reception coil 104 at equal intervals (interval=a). On the lower side of the drawing, only a part 104A of the reception coil 104 in which five markers 1041 are provided is shown for simplicity of description.

The subject to be examined, the reception coil 104, and the markers 1041 thereof are shown in the camera image 300. However, in a case where the reception coil 104 is a deformable or flexible reception coil such as a blanket, the position of the marker 1041 is different from a case where the reception coil is placed in a planar shape because the reception coil 104 is bent (deformed). Therefore, the collation with the two-dimensional design information of the reception coil cannot be performed as it is.

In the present embodiment, the deformation of the reception coil is estimated from the position of the marker 1041 of the reception coil 104 and corrected, and then the collation is performed. For example, as shown in FIG. 12, in the camera image 300, in a case where a distance between markers, such as between the first marker and the second marker and between the fourth marker and the fifth marker, is not a flat state distance "a" but "b", it can be estimated that the reception coil 104 is deformed at an angle θ ($=\cos^{-1}(b/a)$) between the markers. By reflecting this deformation in the distance between markers of the reception coil 104 to calculate the distance between markers, the distance between markers in the plane state can be obtained.

Figure 12:
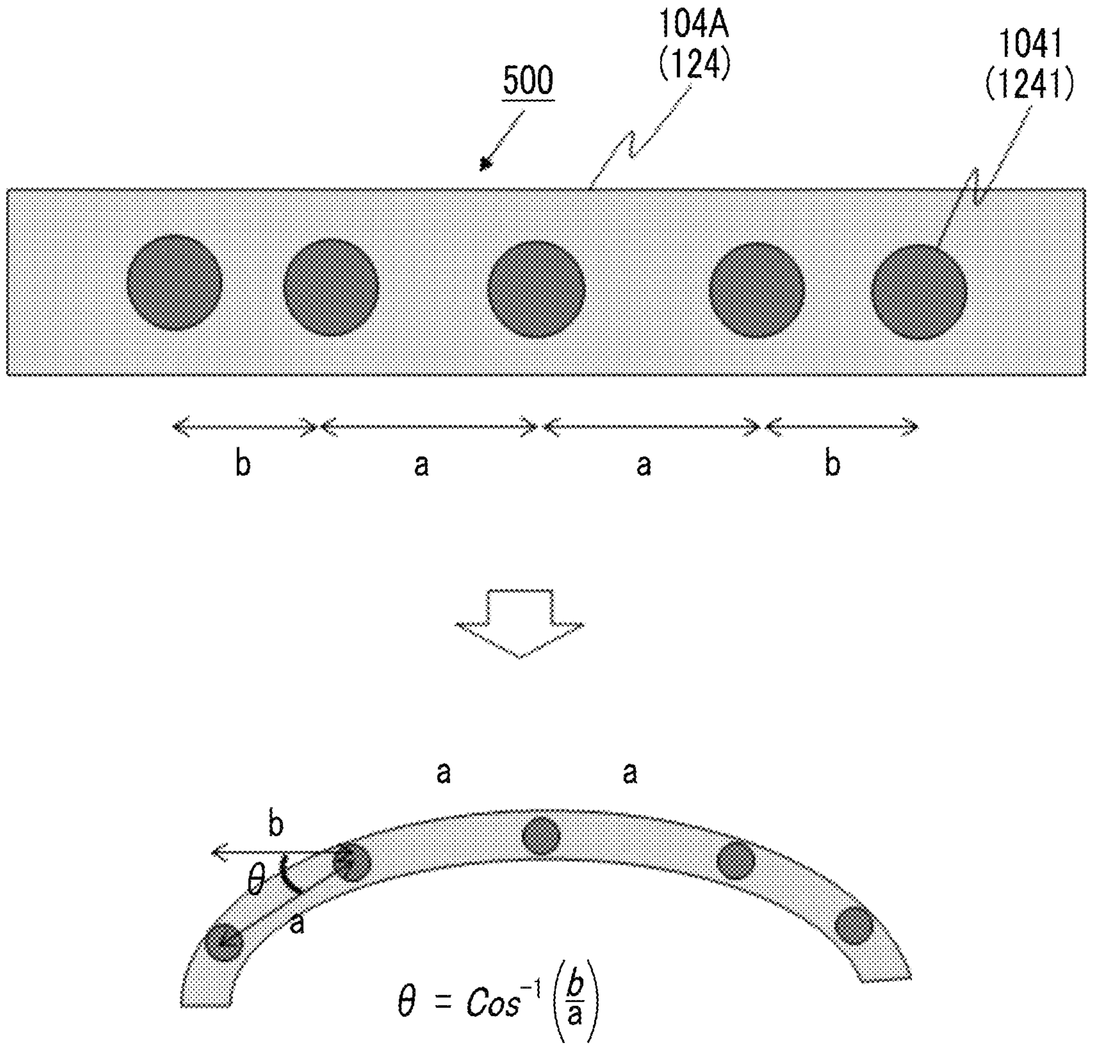
FIG. 12 is a diagram illustrating correction using an interval of markers disposed on the reception coil or a fixing belt.

Although not shown in FIG. 12, specifying the target position of the subject to be examined from the camera image or the MR image acquired in advance is the same as in the above-described embodiment or modification example, and the description thereof will be omitted here.

Figure 13:
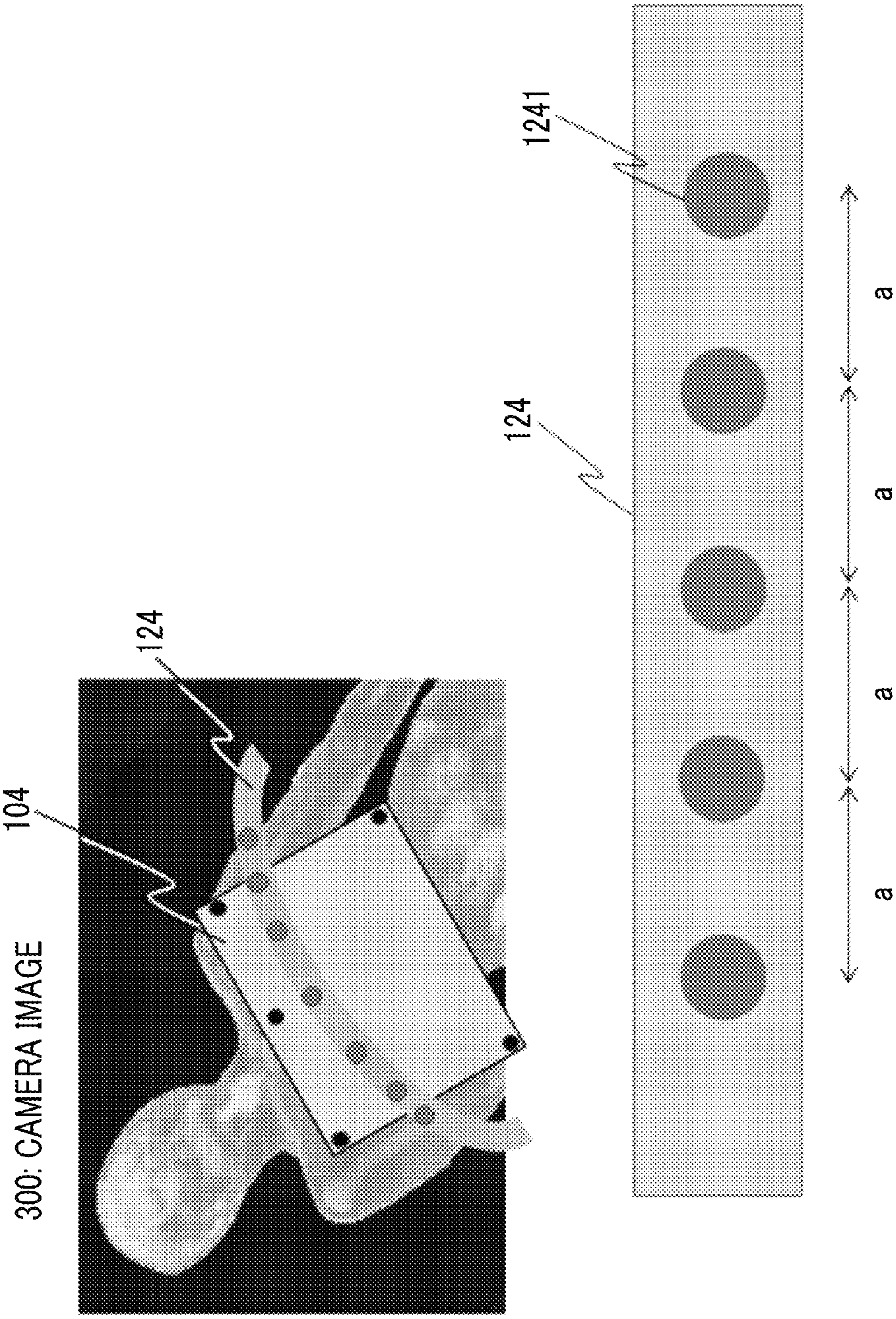
FIG. 13 is a diagram showing a modification example of Embodiment 4 using the fixing belt.

In addition, in FIG. 11, the markers are installed on the reception coil 104 at a predetermined interval, but as shown in FIG. 13, the reception coil 104 may be fixed by a fixing belt 124, and in this case, the same markers 1241 as those in FIG. 11 may be disposed on the fixing belt 124. By installing the markers on the fixing belt 124, it is possible to correctly recognize the markers because the fixing belt itself has the markers 1241 even in a case where the fixing belt 124 is installed on the marker 1041 on the reception coil 104. By installing the marker on an object to be assumed to be installed on an outermost side, it is possible to accurately recognize the marker.

After that, collating the corrected disposition of the marker 1041 or 1241, and the target position with the design information of the reception coil 104, selecting the channel including the target position, and determining the coil region including the selected channel and the FOV are the same as in Embodiment 1.

According to the present embodiment, by attaching the marker to the fixing belt for fixing the reception coil to the subject to be examined and capturing the marker in the camera image, an error in the two-dimensional position information (distance between elements) obtained in the camera image due to the bending of the reception coil can be corrected.

Embodiment 5

Figure 15:
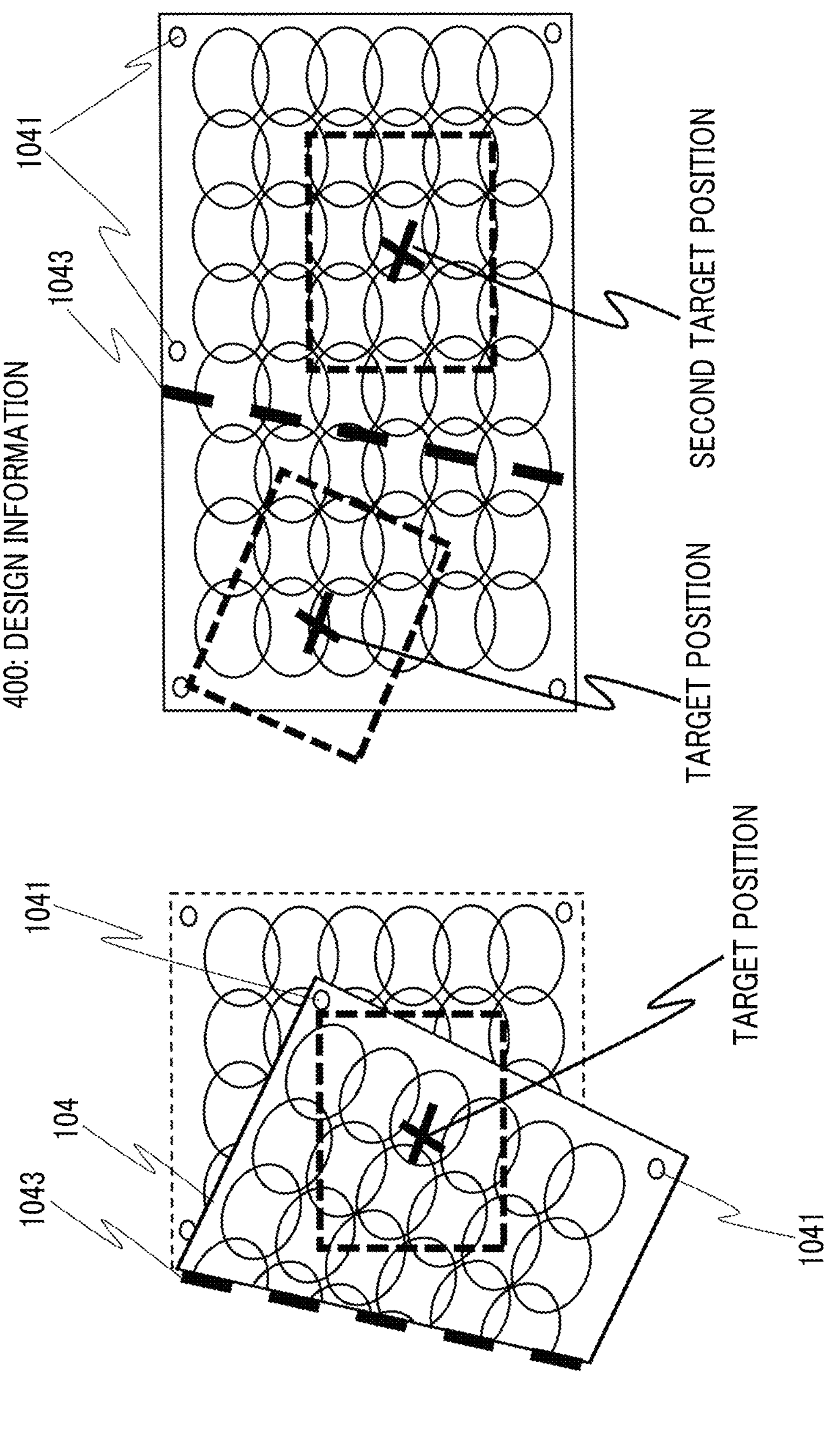
FIG. 15 is a diagram illustrating processing of Embodiment 5.
Figure 16:
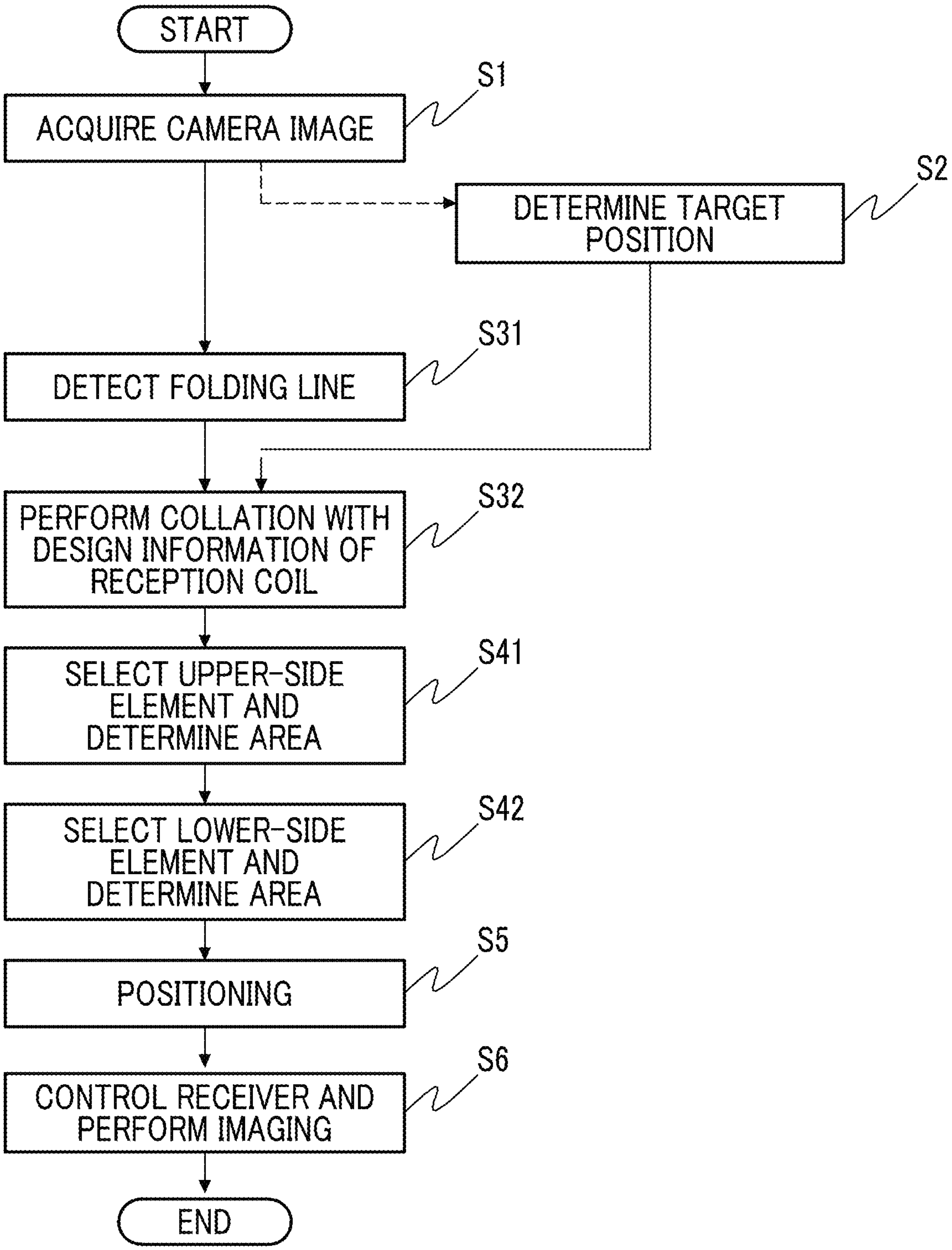
FIG. 16 is a diagram showing a processing flow of Embodiment 5.

Embodiments 1 to 4 are embodiments to be applied to the reception coil of a type in which the reception coil is placed on the subject to be examined or the subject to be examined is disposed on the reception coil, but the present embodiment is an embodiment to be applied to the reception coil of a type in which the reception coil is folded in half or wound around, and mounted on the subject to be examined. Hereinafter, the present embodiment will be described with reference to FIGS. 14 to 16. In FIG. 16 showing the procedure of the present embodiment, blocks showing the same procedures as those in FIG. 4 are designated by the same reference numerals, and the description thereof will be omitted.

Figure 14:
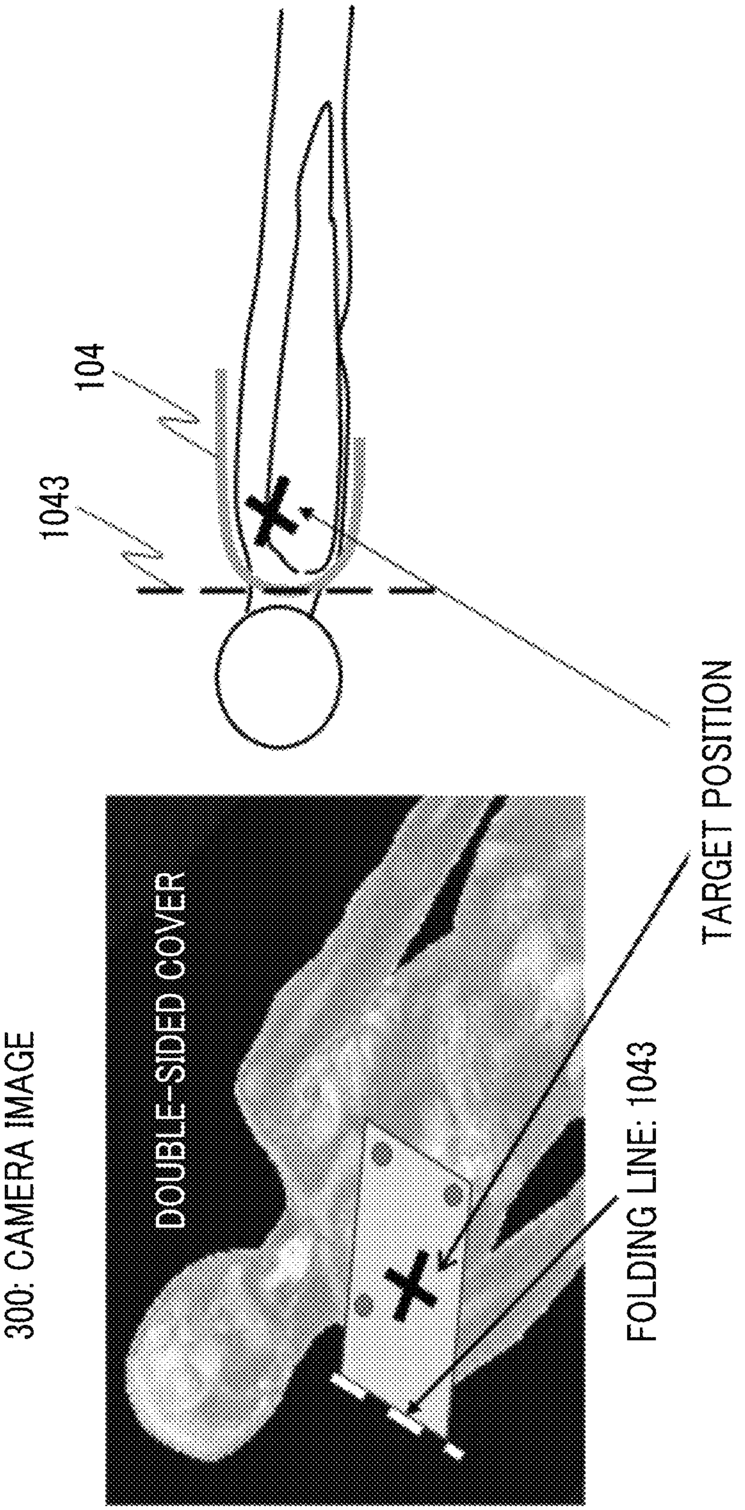
FIG. 14 is a diagram illustrating a reception coil to which Embodiment 5 is applied.

FIG. 14 shows a camera image 300 in a state in which the target position is located in the vicinity of an upper arm end part (shoulder) of the subject to be examined, and the blanket-like reception coil 104 is folded over the shoulder of the subject to be examined so as to surround the target position and is disposed on a chest side and a back side. The reception coil 104 disposed on the chest side and the marker 1041 attached to the reception coil 104 are shown in this camera image. The target position may be designated and specified by a gesture or the like as in Embodiment 1, but in this example, the target position is specified based on the pre-scan image (S1 and S2).

In a case where the collation section 215 collates this camera image 300 (marker position) with the design information of the reception coil, the collation section 215 detects a folding line 1043 of the camera image 300 and specifies a line corresponding to the folding line 1043 on the design information (S31). The left side of FIG. 15 shows the folding line 1043 specified from the camera image, a portion (non-hidden portion) of the reception coil on the chest side of the subject to be examined, and the marker 1041. The element in a range including the target position is selected by using the position information obtained from this camera image and the target position in the camera image obtained from information on the target position specified by the target position specification section 213 (the position information in the apparatus coordinate system in a case of the pre-scan image), and the coil region 503 is determined (S41). The collation between the camera image and the real space (apparatus coordinate system) can be performed by the collation with the marker or the like of which the position is confirmed in the apparatus coordinate system in the camera image, as described in the above-described modification example.

Next, the folding line in the design information (CAD data) 400 of the reception coil is determined, and a lower-side element (hidden portion) that is line-symmetric to the selected element with respect to the folding line is selected on the CAD data (S42).

In this example, as shown on the right side of FIG. 15, it is assumed that the target positions exist at substantially equal distances with the folding line 1043 detected in the camera image interposed therebetween, but in a case where the thickness of the subject to be examined is large or the like, the distance between the folding line and the target position may be different between the front side and the rear side of the reception coil depending on the position of the camera. In this case, a correction value obtained by considering the thickness of the subject to be examined may be added to the folding line. For example, the folding line may be obtained by shifting the position detected as the folding line by a predetermined amount (<thickness/2>xany coefficient) in a direction away from the target position.

After that, moving the target position to the magnetic field center, and activating the element in the selected coil region to perform the imaging are the same as in other embodiments (S5 and S6). Although the example shown in the drawing shows a case where there is one folding line, the present embodiment can be similarly applied to a case where there are folding lines on the left and right, for example, in a reception coil of a type that is wound around a torso, or the like.

According to the present embodiment, even for the reception coil that is mounted to have two or more reception coil portions (front and rear) with the target position interposed therebetween, an appropriate coil region for each of the reception coil portions can be determined and activated, and the signal from the target region can be received with high sensitivity.

Modification Example 4: Modification Example of Camera Image

In the above-described embodiment and modification example, a case has been mainly described in which the two-dimensional camera image in which the subject to be examined before being inserted into the gantry is captured by the camera, but depending on the type, function, and disposition of the camera 30, the camera image as described below can be further used.

For example, in a case where the camera includes a fisheye lens or a tracking mechanism of the reception coil and is installed at a position (the entrance, the inside of the bore of the gantry, or the like) where a state inside the bore of the gantry can be imaged, the positioning using the camera image can be performed in addition to the collation with the design information of the reception coil because the camera image can be captured from a position where the reception coil is mounted on the subject to be examined to a position where the subject to be examined is disposed at the magnetic field center.

In addition, in a case where the camera has a video function, the camera image can be captured from a state before mounting the coil to a state after mounting the coil, and the position information of the marker of the reception coil is overwritten to the target position after the target position is specified before the mounting, so that it is not necessary to designate the target position by a projector or the like, and the target position and the position information of the reception coil can be included in the camera image data. As a result, even in a case where an object obstructing the marker is placed on the reception coil in a case of inserting the subject to be examined into the gantry, the collation between the camera image and the design information of the reception coil can be performed without any problem.

Although the embodiments and the modification examples of the present invention have been described above, these can be appropriately combined as long as there is no technical contradiction, and such a combination is also included in the present invention.

EXPLANATION OF REFERENCES

1: MRI apparatus
10: gantry
20: computer
30: camera
40: external storage device
50: display device
50A: display device
60: UI unit
70: subject to be examined
100: imaging unit
104: reception coil
105: bed
124: fixing belt
200: controller
210: channel selection unit
211: camera image acquisition section
213: target position specification section
215: collation section
230: display control unit
240: imaging control unit
300: camera image
400: design information of reception coil
501: line indicating target position
502: FOV
503: coil region
600: imaging guarantee area
1041: marker
1051: marker
1241: marker
1043: folding line

What is claimed is:

1. A magnetic resonance imaging apparatus comprising:
an imaging unit that includes a reception coil including a plurality of coil elements, and a multiple-channel receiver which receives, through the reception coil including the plurality of coil elements, a nuclear magnetic resonance signal generated by a subject to be examined;
one or more processors that control the imaging unit and are configured to
acquire an image from a camera disposed in the magnetic resonance imaging apparatus,
specify a target position of imaging on the subject to be examined, and
collate a camera image, which is acquired by the camera and shows the subject to be examined and on which a reception coil including a plurality of coil elements is mounted, with design information of the reception coil and determine a coil element of the reception coil that covers the specified target position; and one or more markers attached to at least one of the reception coil or a bed and recognizable by the one or more processors, a position of the reception coil being determined by the one or more processors based on a marker amongst the one or more markers.

2. An automatic channel selection method of a multi-channel reception coil, the method being performed by one or more processors for selecting a coil element of a multiple-channel reception coil used in a magnetic resonance imaging apparatus, the method comprising:

a step of acquiring an image from a camera disposed in the magnetic resonance imaging apparatus;

a step of specifying a target position on a subject to be examined on which the reception coil is mounted; and a step of collating a camera image, which shows the subject to be examined on which the reception coil including a plurality of the coil elements is mounted, and the target position with design information of the reception coil and determining a coil element of the reception coil that includes the target position; and a step of determining a position of the reception coil based on one or more markers attached to at least one of the reception coil or a bed on which the subject to be examined is placed or to be placed.

3. The magnetic resonance imaging apparatus according to claim 1, wherein the one or more processors are configured to receive a designation of a position by a user using a camera image which shows the subject to be examined before mounting the reception coil, and specify the designated position as the target position.

4. The magnetic resonance imaging apparatus according to claim 1, wherein one or more processors, upon specifying a target position, receive a designation of a position by a user using a pre-scan image of the subject to be examined, which is acquired in advance by the imaging unit and is displayed on a display device, and specifies the designated position as the target position.

5. The magnetic resonance imaging apparatus according to claim 1, wherein the design information of the reception coil includes a positional relationship between the coil element and the marker, and the one or more processors are configured to collate a marker position included in the camera image with the design information of the reception coil and determine the coil element of the reception coil.

6. The magnetic resonance imaging apparatus according to claim 1, wherein one or more processors are configured to determine a coil region in which the coil element covering the target position is disposed such that the coil region includes a predetermined FOV.

7. The magnetic resonance imaging apparatus according to claim 1, wherein one or more processors are configured to acquire information on an imaging guarantee area determined based on characteristics of a static magnetic field and a gradient magnetic field of the magnetic resonance imaging apparatus and without considering a coil element that is not included in the imaging guarantee area.

8. The magnetic resonance imaging apparatus according to claim 1, wherein the bed incorporates the reception coil, and the one or more processors are configured to calculate the position of the reception coil on apparatus coordinates from a camera image which shows the marker and the subject to be examined, and to determine the coil element of the reception coil that covers the target position by using the position of the reception coil on the apparatus coordinates, the target position specified by the one or more processors, and the design information of the reception coil.

9. The magnetic resonance imaging apparatus according to claim 1, wherein the subject to be examined is placed on the bed, the bed being provided with another marker amongst the one or more markers at a position where a camera image is capable of being acquired, and wherein one or more processors are configured to calculate the position of the reception coil on apparatus coordinates from said another marker and a camera image which shows the subject to be examined and on which the reception coil is mounted and to determine the coil element of the reception coil that covers the target position by using the position of the reception coil on the apparatus coordinates, the target position specified by the one or more processors, and the design information of the reception coil.

10. The magnetic resonance imaging apparatus according to claim 1, wherein a plurality of the markers are attached to the reception coil at equal intervals, and the one or more processors are configured to calculate bending of the reception coil from the interval of the plurality of the markers included in the camera image, correct the bending of the reception coil, then collate the corrected bending with the design information of the reception coil, and determine the coil element of the reception coil.

11. The magnetic resonance imaging apparatus according to claim 1, wherein the reception coil is fixed to the subject to be examined by using a flexible belt, and a plurality of the markers are attached to the flexible belt at equal intervals along a longitudinal direction of the flexible belt, and the one or more processors are configured to calculate bending of the reception coil from the interval of the plurality of the markers included in the camera image, correct the bending of the reception coil, then collate the corrected bending with the design information of the reception coil, and determine the coil element of the reception coil.

12. The magnetic resonance imaging apparatus according to claim 1, wherein the one or more processors are configured to detect a folding line of the reception coil from the camera image which shows the subject to be examined on which the reception coil is mounted, and specify a coil element of another part of the reception coil, which is line-symmetric to a coil element determined for a part of the reception coil shown in the camera image with respect to the folding line, and determine the coil element of the part and the coil element of the other part as the coil elements of the reception coil.

13. The magnetic resonance imaging apparatus according to claim 1, wherein the camera is a camera including any one of a fisheye lens, a subject tracking mechanism, or a video function, and the one or more processors are configured to acquire information on a camera image including a temporal change or a spatial change of a subject as the camera image.

14. The automatic channel selection method of a multichannel reception coil according to claim 2, wherein the step of specifying the target position includes a step of receiving a designation of a site by a user in the displayed camera image, and the received site is specified as the target position.

15. The automatic channel selection method of a multichannel reception coil according to claim 2, wherein the step of specifying the target position includes a step of analyzing the camera image by using an anatomical database and a step of specifying one of a plurality of sites included in the anatomical database as a target site, and a position of the camera image that corresponds to the specified target site is specified as the target position.

16. The automatic channel selection method of a multichannel reception coil according to claim 2, wherein the design information of the reception coil includes a positional relationship between the coil element and at least one of the one of more markers, and the automatic channel selection method further comprises collating a marker position included in the camera image with the design information of the reception coil and determining the coil element of the reception coil.

17. The magnetic resonance imaging apparatus according to claim 3, wherein one or more processors are configured to analyze the camera image including the designated position of the user by using an anatomical database and specify a predetermined site in the anatomical database as the target position.

18. The magnetic resonance imaging apparatus according to claim 9, wherein the bed incorporates a second reception coil, and said another marker indicates a position of the incorporated second reception coil.

19. The magnetic resonance imaging apparatus according to claim 18, wherein the one or more processors are configured to set a region of the second reception coil, onto which a region where a coil element of the reception coil mounted on the subject to be examined is disposed is projected in a direction orthogonal to the bed, as a coil selection region.

* * * * *